United States Patent
Chew et al.

(10) Patent No.: US 11,938,543 B2
(45) Date of Patent: Mar. 26, 2024

(54) SILVER SINTERING PREPARATION AND THE USE THEREOF FOR THE CONNECTING OF ELECTRONIC COMPONENTS

(71) Applicant: Heraeus Deutschland Gmbh & Co. KG, Hanau (DE)

(72) Inventors: Ly M. Chew, Bruchkobel (DE); Gregory Berube, Nashua, NH (US); Seigi Suh, Chesterbrook, PA (US)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 239 days.

(21) Appl. No.: 17/301,642

(22) Filed: Apr. 9, 2021

(65) Prior Publication Data
US 2022/0324021 A1 Oct. 13, 2022

(51) Int. Cl.
| | | |
|---|---|---|
| B22F 7/06 | (2006.01) | |
| B22F 1/16 | (2022.01) | |
| B22F 7/04 | (2006.01) | |
| H01L 23/00 | (2006.01) | |
| H01R 4/58 | (2006.01) | |

(52) U.S. Cl.
CPC .......... B22F 7/064 (2013.01); B22F 1/16 (2022.01); B22F 7/04 (2013.01); H01L 24/29 (2013.01); H01R 4/58 (2013.01); *B22F 2301/255* (2013.01); *H01L 2224/05639* (2013.01)

(58) Field of Classification Search
CPC .......... B22F 1/16; B22F 7/04; B23K 35/3006
See application file for complete search history.

(56) References Cited

U.S. PATENT DOCUMENTS

| | | | | |
|---|---|---|---|---|
| 6,730,400 | B1 * | 5/2004 | Komatsu ................ | B22F 1/102 75/371 |
| 10,065,273 | B1 | 9/2018 | Oestreicher et al. | |
| 10,910,340 | B1 | 2/2021 | Chew et al. | |
| 2004/0245648 | A1 * | 12/2004 | Nagasawa ................ | C09J 5/06 257/772 |
| 2008/0160183 | A1 * | 7/2008 | Ide ........................ | H01L 24/29 252/500 |
| 2009/0162557 | A1 * | 6/2009 | Lu ........................ | B22F 1/103 427/383.1 |
| 2012/0103515 | A1 * | 5/2012 | Endoh .................... | B22F 1/054 156/325 |
| 2012/0153011 | A1 | 6/2012 | Schafer et al. | |
| 2012/0055978 | A1 | 8/2012 | Schafer et al. | |
| 2015/0028085 | A1 * | 1/2015 | Endoh .................... | B22F 1/102 148/24 |
| 2016/0121435 | A1 * | 5/2016 | Furukawa ............... | H01L 24/83 428/323 |
| 2017/0117209 | A1 * | 4/2017 | Benedikt ................. | H01L 24/84 |
| 2017/0243849 | A1 | 8/2017 | Sasaki et al. | |
| 2017/0326640 | A1 * | 11/2017 | Schmitt ................... | B22F 1/068 |
| 2018/0056449 | A1 | 3/2018 | Zhu et al. | |
| 2018/0147673 | A1 * | 5/2018 | Schmitt ................... | B22F 1/17 |
| 2019/0194517 | A1 * | 6/2019 | Ghosal .................... | B22F 1/10 |

FOREIGN PATENT DOCUMENTS

| | | | | |
|---|---|---|---|---|
| EP | 2396129 | A1 | 12/2011 | |
| JP | 2006083414 | A * | 3/2006 | |
| JP | 2006083414 | A | 3/2006 | |
| JP | 2006089818 | A | 4/2006 | |
| JP | 2018165387 | A * | 10/2018 | .......... B22F 1/00 |
| WO | 2013156570 | A1 | 10/2013 | |
| WO | 2016028221 | A1 | 2/2016 | |

OTHER PUBLICATIONS

International Search Report PCT/EP2022/052391 dated May 11, 2022, dated May 24, 2022.

* cited by examiner

*Primary Examiner* — Samir Shah
*Assistant Examiner* — Austin Pollock
(74) *Attorney, Agent, or Firm* — Blank Rome LLP

(57) ABSTRACT

A silver sintering preparation in the form of a silver sintering paste comprising 70 to 95 wt.-% of coated silver particles (A) and 5 to 30 wt.-% of organic solvent (B) or in the form of a silver sintering preform comprising 74.5 to 100 wt.-% of coated silver particles (A) and 0 to 0.5 wt.-% of organic solvent (B), wherein the coating of the coated silver particles (A) comprises silver acetylacetonate (silver 2,4-pentanedionate) and/or at least one silver salt of the formula $C_nH_{2n+1}COOAg$ with n being an integer in the range of 7 to 10, and wherein the at least one silver salt is thermally decomposable at >160° C.

18 Claims, No Drawings

SILVER SINTERING PREPARATION AND THE USE THEREOF FOR THE CONNECTING OF ELECTRONIC COMPONENTS

The present invention relates to a silver sintering preparation and to a method for the connecting (joining) of electronic components, in which said silver sintering preparation is used.

Silver sintering technology has become state of the art as a method of connecting (joining) of electronic components, see, for example, WO2011/026623 A1, WO2011/0266243 A1 and WO2016/028221 A1, US 2017/0243849 A1 and US 2018/0056449 A1.

The term "electronic component" used herein refers to substrates and to active and passive components being used in electronics. The electronic components have metal contact surfaces.

Examples of substrates include IMS (insulated metal substrates), AMB substrates (active metal brazed substrates), metal ceramic substrates, e.g. DCBs (direct copper bonded substrates), ceramic substrates, PCBs (printed circuit boards) and leadframes.

Examples of active components include diodes, LEDs (light emitting diodes), dies, IGBTs (insulated gate bipolar transistors), MOSFETs (metal oxide semiconductor field effect transistors), and ICs (integrated circuits).

Examples of passive components include sensors, baseplates, heat sinks, resistors, capacitors, inductors, antennae and connecting elements (e.g. clips).

It has been disclosed that silver sinter joints can be formed on bare copper surfaces without applying mechanical pressure during a sintering process using a sinter paste based on silver nanoparticles or based on a mixture of silver microparticles (typically in the range of 1 to 10 µm in size) and silver nanoparticles (typically in the range of 1 to 100 nanometer in size). Examples of such disclosures comprise: H. Miyoshi, K. Endoh, S. Kurita, "Application of Silver Nano Particles to Pressureless Bonding onto a Copper Surface—Consideration of Substitute Material for Lead Solder", CIPS conference 2014; H. Zheng, D. Berry, K. D. T. Ngo, G. Lu, "Chip-Bonding on Copper by Pressureless Sintering of Nanosilver Paste Under Controlled Atmosphere", IEEE Transactions on Electronic components, Packaging and Manufacturing Technology, Vol. 4, No. 3, March 2014; H. Zheng, J. Calata, K. Nog, S. Luo, G. Lu, "Low-pressure (<5 MPa) Low-temperature Joining of Large-area Chips on Copper Using Nanosilver paste", CIPS conference 2012; and T. Watanabe, N. Nakajima, M. Takesue, "Material Design and Process Conditions of Pressureless Sintered Silver for 200/40° C. Thermal Cycling Reliability", PCIM Europe 2017.

It is an object of the invention to provide a silver sintering method for the connection of electronic components in reliable manner; typically such connection happens via metal contact surfaces of the electronic components. In particular, the silver sintering method to be found shall be well-suited for connecting electronic components at least one of which having a non-precious metal contact surface like a copper surface with high reliability. It is another object of the present invention to provide a silver sintering preparation that is well-suited for implementing such sintering method. Formation of reliable connections should be enabled even on non-pretreated non-precious metal contact surfaces of electronic components and even at low sintering temperatures with or without application of mechanical pressure during sintering.

The invention relates to a method for the connection of electronic components, in which (a) a sandwich arrangement is provided, which comprises at least (a1) an electronic component 1, (a2) an electronic component 2, and (a3) a silver sintering preparation being situated between metal contact surfaces of the electronic components, and in which (b) the sandwich arrangement is being sintered, whereby the silver sintering preparation is either a silver sintering paste comprising 70 to 95 wt.-% (% by weight) of coated silver particles (A) and 5 to 30 wt.-% of organic solvent (B)

or a silver sintering preform comprising 74.5 to 100 wt.-% of coated silver particles (A) and 0 to 0.5 wt.-% of organic solvent (B), wherein the coating of the coated silver particles (A) comprises silver acetylacetonate (silver 2,4-pentanedionate) and/or at least one silver salt of the formula $C_nH_{2n+1}COOAg$ with n being an integer in the range of 7 to 10, and wherein the at least one silver salt is thermally decomposable at >160° C.

Moreover, the invention relates to a silver sintering preparation either in the form of a silver sintering paste comprising 70 to 95 wt.-% of coated silver particles (A) and 5 to 30 wt.-% of organic solvent (B)

or in the form of a silver sintering preform comprising 74.5 to 100 wt.-% of coated silver particles (A) and 0 to 0.5 wt.-% of organic solvent (B), wherein the coating of the coated silver particles (A) comprises silver acetylacetonate (silver 2,4-pentanedionate) and/or at least one silver salt of the formula $C_nH_{2n+1}COOAg$ with n being an integer in the range of 7 to 10, and wherein the at least one silver salt is thermally decomposable at >160° C.

A silver sintering preform is a foil-like piece of solidified, i.e. dried and not or only partly sintered silver sintering paste. It can be made by applying silver sintering paste onto a flat carrier, drying the so applied paste without or without completely sintering it and thereafter peeling it off.

In a first embodiment, the silver sintering preparation of the invention is a silver sintering paste comprising 70 to 95 wt.-% of coated silver particles (A) and 5 to 30 wt.-% of organic solvent (B).

In a second embodiment, the silver sintering preparation of the invention is a silver sintering preform comprising 74.5 to 100 wt.-% of coated silver particles (A) and 0 to 0.5 wt.-% of organic solvent (B).

The silver sintering paste of the invention comprises 70 to 95 wt.-%, preferably 75 to 85 wt.-%, most preferably 80 to 85 wt.-% of the coated silver particles (A), wherein the coating of the coated silver particles (A) comprises silver acetylacetonate and/or at least one silver salt of the formula $C_nH_{2n+1}COOAg$ with n being an integer in the range of 7 to 10, and wherein the at least one silver salt is thermally decomposable at >160° C.

The silver sintering preform of the invention comprises 74.5 to 100 wt.-%, preferably 96 to 100 wt.-% of the coated silver particles (A), wherein the coating of the coated silver particles comprises silver acetylacetonate and/or at least one silver salt of the formula $C_nH_{2n+1}COOAg$ with n being an integer in the range of 7 to 10, and wherein the at least one silver salt is thermally decomposable at >160° C.

The term "silver particles" used herein refers to particles of pure silver (silver with a purity of at least 99.90 wt.-%, preferably at least 99.95 wt.-%) or of a silver alloy having a silver content in the range of 55 to <95 wt.-%.

The shape of the coated silver particles (A) may vary. The coated silver particles (A) can be flakes (platelets) and/or granules and/or spheres. Flakes are flat particles exhibiting an aspect ratio bigger than 10:1 as opposed to granules (aspect ratio typically between 1:1 and 5:1) or spheres (aspect ratio of 1:1).

The mean particle diameter (d50) of the coated silver particles (A) can be in the range of, for example, 0.1 to 20 µm, preferably 0.2 to 10 µm, more preferred 0.2 to 5 µm. The term "mean particle size" ("average particle size") used herein means the mean particle diameter (d50) determined by means of laser diffraction. Laser diffraction measurements can be carried out making use of a particle size analyzer, for example, a Mastersizer 3000 from Malvern Instruments.

The coating of the coated silver particles (A) comprises silver acetylacetonate and/or at least one silver salt of the formula $C_nH_{2n+1}COOAg$ with n being an integer in the range of 7 to 10, wherein the at least one silver salt is thermally decomposable at >160° C.

Both, the silver acetylacetonate as well as the at least one silver salt are thermally decomposable at >160° C., for example, in a range of >160° C. to 300° C.; i.e. when the silver sinter preparation of the invention is used and sintered as pointed out in more detail below, the silver acetylacetonate or, respectively, the at least one silver salt experience temperatures above 160° C. and it/they decomposes/decompose then accordingly. It is believed that, under such temperature conditions, the silver acetylacetonate or, respectively, the at least one silver salt decompose at least predominantly under formation of elemental silver.

The "n" in the formula $C_nH_{2n+1}COOAg$ is an integer in the range of 7 to 10, preferably 8 to 10, and most preferred 10. The alkyl group $C_nH_{2n+1}$ can be linear, but it is preferably branched. Preferably, the branching is characterized by the carbon atom in position 2 (the carbon atom linked to the —COOAg group) carrying 2 or, even more preferred, 3 alkyl substituents.

Examples of the at least one silver salt include silver neodecanoate, silver 2-ethylhexanoate, silver 2-butylhexanoate, silver 2,5-dimethyl-2-ethylhexanoate, silver 2-ethyloctanoate, silver 2,2-dimethyloctanoate, silver 2,2-diethylhexanoate. Silver neodecanoate is a particularly preferred example.

Preferably, the fraction of the silver acetylacetonate and/or the at least one silver salt, relative to the entire coating is at least 60 wt.-%, more preferably at least 90 wt.-%, in particular at least 95 wt.-%, at least 99 wt.-% or 100 wt.-%.

The fraction of the silver acetylacetonate and/or the at least one silver salt is ≤20 wt.-%, for example, 1 to 20 wt.-%, preferably 1 to 15 wt.-%, relative to the weight of the coated silver particles (A).

The silver sintering paste of the invention comprises 5 to 30 wt.-%, preferably 8 to 25 wt.-% and most preferably 10 to 20 wt.-% of organic solvent (B), i.e. one organic solvent or a mixture of at least two organic solvents.

The silver sintering preform of the invention comprises 0 to 0.5 wt.-% of organic solvent (B), i.e. one organic solvent or a mixture of at least two organic solvents.

The organic solvent or solvents (B) is/are organic solvent(s) that is/are used commonly for silver sintering preparations. Examples include alcohols, e.g. terpineols, tridecanols; glycol ethers, e.g. tripropylene glycol monomethyl ether, dipropylene glycol monobutyl ether, diethylene glycol monohexyl ether, butyl polyglycol; esters, e.g. dipropylene glycol methylether acetate, diethyl adipate, dibasic esters.

In a preferred embodiment, the silver sintering paste of the invention comprises 75 to 85 wt.-% of the coated silver particles (A) and 8 to 25 wt.-% of organic solvent (B).

In a preferred embodiment, the silver sintering preform of the invention comprises 96 to 100 wt.-% of the coated silver particles (A) and 0 to 0.5 wt.-% of organic solvent (B).

In both of its embodiments, the silver sintering preparation of the invention can comprise, for example, 0 to 20 wt.-% of silver particles (C) other than the coated silver particles (A).

Silver particles (C) can have a coating, for example, a coating of fatty acid and/or of fatty acid derivative. However, silver particles (C) do not have a coating that comprises any silver compound.

It is preferred that neither the silver sintering paste of the invention nor the silver sintering preform of the invention comprise silver particles (C).

In both of its embodiments, the silver sintering preparation of the invention can comprise, for example, 0 to 5 wt.-% of at least one particulate silver precursor (D).

A particulate silver precursor (D) can take the shape of flakes or a spherical (ball-like) shape. It is a particulate silver compound that decomposes at temperatures below 200° C. while releasing elemental silver. Examples of such silver precursors (D) include silver carbonate, silver(I) lactate, silver(II) formate, silver citrate, silver oxide (for example AgO or $Ag_2O$).

It is preferred that the silver sintering paste of the invention comprises no particulate silver precursor (D); same is true for the silver sintering preform of the invention.

In both of its embodiments, the silver sintering preparation of the invention can comprise, for example, 0 to 2.5 wt.-% of at least one cellulose derivative (E).

Examples of cellulose derivatives (E) include methylcellulose, ethylcellulose, ethylmethylcellulose, carboxycellulose, hydroxypropylcellulose, hydroxyethylcellulose and hydroxymethylcellulose.

In both of its embodiments, the silver sintering preparation of the invention can comprise, for example, 0 to 5 wt.-% of at least one fatty compound (F) selected from the group consisting of fatty acids, fatty acid esters, fatty acid salts, fatty alcohols, fatty amines and fatty amides.

In both of its embodiments, the silver sintering preparation of the invention can comprise a total of, for example, 0 to 3 wt.-% of one or more further ingredients (G) other than ingredients (A) to (F).

Preferred further ingredients (G) include ingredients that are commonly used in silver sintering preparations. Examples include additives like polymers other than cellulose derivatives, dispersion agents, surfactants, defoaming agents, viscosity-controlling (rheological) agents and sintering agents.

It is preferred that the silver sintering paste of the invention comprises no further ingredients (G); same is true for the silver sintering preform of the invention.

In case the silver sintering preparation of the invention comprises ingredients (E) and/or (F) and/or (G), it is preferred that those ingredients do not total more than 4 wt.-% and it is at the same time especially preferred that no ingredients (C) and (D) are comprised.

The wt.-% fractions specified for ingredients (A) to (G) can add up, for example, to 100 wt.-% with respect to the silver sintering preparation of the invention. Accordingly, the silver sintering paste of the invention can be produced by mixing ingredients (A) to (G). Devices known to a person skilled in the art, such as stirrers and three-roller mills, can be used in this context. The silver sintering preform of the invention can be produced in accordance with the method disclosed above for making silver sintering preforms.

The silver sintering preparation of the invention can be used in a method for the connection of electronic components, the method including a sintering process. Sintering shall be understood to mean the connecting of two or more electronic components by heating without the silver of the coated silver particles (A) reaching the liquid phase. In the context of the present disclosure said use is a method for the connection of electronic components, in which (a) a sandwich arrangement is provided, which comprises at least (a1) an electronic component 1, (a2) an electronic component 2, and (a3) the silver sintering preparation according to any of its afore disclosed embodiments being situated between metal contact surfaces of the electronic components 1 and 2, and in which (b) the sandwich arrangement is being sintered.

As is conventional for electronic components, each of the electronic components 1 and 2 has a metal contact surface. In as far as the electronic components 1 and 2 do not consist of metal their contact surfaces are covered by a metal or metallization layer. In an embodiment, the metal contact surfaces can be made of a non-precious metal such as, for example, copper, nickel or aluminum. In another embodiment, the metal contact surfaces can be made of a precious metal such as silver. It is also possible, that one of the metal contact surfaces is made of a non-precious metal and the other metal contact surface is made of a precious metal.

Connecting at least two electronic components shall be understood to mean attaching a first electronic component on a second electronic component. In this context, "on" simply means that a metal contact surface of the first electronic component is being connected to a metal contact surface of the second electronic component regardless of the relative disposition of the two electronic components or of the sandwich arrangement comprising the at least two electronic components.

The electronic components 1 and 2 to be connected can be identical or different electronic components. The present invention facilitates not only the connection of precious metal contact surfaces of the electronic components, but also, in particular, the connection of a non-precious metal contact surface to a precious metal contact surface or even the connection of two non-precious metal contact surfaces of the electronic components in a manner that results in a reliable connection at room temperature and at elevated temperatures. For example, aluminum-nickel, aluminum-copper, aluminum-silver, aluminum-aluminum, copper-silver, copper-nickel, copper-copper, silver-nickel or silver-silver connections can be formed. The terms "aluminum, copper, nickel and silver metal contact surfaces" include metal contact surfaces made of alloys of said metals. Just like in case of silver or other precious metal contact surfaces, even in case of non-precious metal contact surfaces like copper, nickel or aluminum surfaces there is no need for a pretreatment thereof prior to carrying out the sintering step (b), and there is especially no need for a reductive pretreatment prior to carrying out the sintering step (b).

Accordingly, if two electronic components, i.e. electronic component 1 and electronic component 2, are to be connected to each other, the silver sintering preparation of the invention is situated between the metal contact surfaces of electronic component 1 and electronic component 2 prior to performing the sintering process of step (b). On the other hand, it is conceivable to connect more than two electronic components to each other. For example, three electronic components, i.e. electronic component 1, electronic component 2 and an electronic component 3, can be connected to each other in appropriate manner such that electronic component 2 is situated between electronic component 1 and electronic component 3. In this case, the silver sintering preparation of the invention is situated between both electronic component 1 and electronic component 2 as well as between electronic component 2 and electronic component 3, or, to be more precise, between the metal contact surfaces thereof.

Preferably, first, the metal contact surface of one of the electronic components is provided with the silver sintering preparation of the invention. Then, the other electronic component is placed by its metal contact surface on the silver sintering preparation of the invention that has been applied to the metal contact surface of the first electronic component.

Application of the silver sintering paste of the invention onto the metal contact surface of an electronic component can be performed by means of conventional methods. Examples include dispensing, screen printing, stencil printing, pin transfer and dipping. Preferably, the thickness of the wet layer of the silver sintering paste between the electronic components to be connected is in the range of 50 to 150 μm. In this context, thickness of the wet layer shall be understood to mean the layer thickness prior to drying, if any, and prior to sintering step (b). The preferred wet layer thickness depends on the method selected for applying the silver sintering paste. If the silver sintering paste is applied, for example, by means of screen printing or dispensing, the wet layer thickness can preferably be in the range of 50 to 80 μm. If the silver sintering paste is applied by means of stencil printing, the preferred wet layer thickness can be in the range of 50 to 100 μm.

Application of the silver sintering preform of the invention onto the metal contact surface of an electronic component can be performed by simply placing it between the metal contact surfaces of the electronic components to be connected to each other.

If the silver sintering paste of the invention has been applied, an optional drying step can be introduced prior to the sintering step (b), i.e. organic solvent (B) is then removed from the applied silver sintering paste. The drying step can be performed prior to forming the sandwich arrangement, i.e. after application of the silver sintering paste to the metal contact surface of electronic component 1 and before connecting with the metal contact surface of electronic component 2, or after assembling of the sandwich arrangement. According to a preferred embodiment, the fraction of organic solvent (B) in the silver sintering paste after drying is, for example, 0 to 5 wt.-% with respect to the original fraction of organic solvent (B) in the silver sintering paste of the invention, i.e. in the silver sintering paste ready for application. In other words, according to said preferred embodiment, for example, 95 to 100 wt.-% of the organic solvent (B) that is originally present in the silver sintering paste of the invention are removed during drying. The drying temperature can be in the range of, for example, 100 to 150° C. Common drying times are in the range of, for example, 5 to 45 minutes.

The sandwich arrangement of the at least two electronic components 1 and 2 and the silver sintering preparation of the invention situated between their metal contact surfaces is finally subjected to a sintering process in step (b).

Regardless of the metal contact surface type of the electronic components to be connected, the actual sintering can proceed at a temperature of, for example, in the range of 200 to <300° C. or 200 to 280° C. with or without applying mechanical pressure and/or with or without pretreatment of the precious metal or non-precious metal contact surfaces.

The sintering time is, for example, in the range of 2 to 60 minutes, for example, in the range of 2 to 5 minutes in pressure sintering and, for example, in the range of 30 to 60 minutes in sintering without mechanical pressure.

The mechanical pressure in pressure sintering is preferably less than 30 MPa and more preferably less than >15 MPa. For example, the mechanical pressure is in the range of 1 to 30 MPa and more preferably it is in the range of 5 to 15 MPa.

Performing the sintering step (b) without application of mechanical pressure allows pressure-sensitive, for example fragile electronic components or electronic components with a mechanically sensitive micro-structure, to be used. Electronic components that have a mechanically sensitive micro-structure suffer electrical malfunction when exposed to inadmissible mechanical pressure.

The sintering step (b) can take place in an atmosphere that is not subject to any specific limitations. Use of a reducing atmosphere like a hydrogen/nitrogen or formic acid/nitrogen gas mixture or vacuum is not necessary although possible. Accordingly, on the one hand, the sintering can take place in an atmosphere that comprises oxygen, provided no non-precious metal contact surface of an electronic component is involved in the sintering. On the other hand, it is feasible just as well that the sintering takes place in an inert or oxygen-free atmosphere, for example, a nitrogen or argon atmosphere. In case a non-precious metal contact surface of an electronic component is involved in the sintering of step (b) it is a requirement to work in an inert or oxygen-free atmosphere; however, working in a reducing atmosphere is even in such case not required. In the scope of the invention, an oxygen-free atmosphere shall be understood to mean an atmosphere whose oxygen content is no more than 100 ppm, preferably no more than 80 ppm, and even more preferably no more than 50 ppm.

The sintering step (b) can take place in a conventional suitable apparatus for sintering, in which the above-mentioned process parameters can be set.

In order to obtain a connection strength between the electronic components which fulfills or even exceeds requirements (a stable connection), the method of the invention does neither require a pretreatment of the metal contact surfaces of the electronic components to be connected nor an extraordinary high sintering temperature nor application of mechanical pressure during sintering; this is true independent of the metal type of the metal contact surfaces involved. As has already been disclosed above, in case of a non-precious metal contact surface being involved, the requirement of performing sintering step (b) in an inert or oxygen-free atmosphere or in a vacuum needs to be met; however, working in a reducing atmosphere is not required.

Hence, in an embodiment, it is even possible that the method of the invention is a method for the connection of electronic components, in which (a) a sandwich arrangement is provided, which comprises at least (a1) an electronic component 1, (a2) an electronic component 2, and (a3) the silver sintering preparation according to any of its afore disclosed embodiments being situated between non-pretreated metal contact surfaces of the electronic components, and in which (b) the sandwich arrangement is being sintered, wherein the metal of at least one of the non-pretreated metal contact surfaces of the electronic components is a non-precious metal, and wherein the sintering step (b) is carried out in an inert atmosphere without application of mechanical pressure at a sintering temperature in the range of 200 to <300° C.

In a specific and advantageous embodiment, the method of the invention is a method for the connection of electronic components, in which (a) a sandwich arrangement is provided, which comprises at least (a1) an electronic component 1, (a2) an electronic component 2, and (a3) the silver sintering preparation according to any of its afore disclosed embodiments being situated between non-pretreated metal contact surfaces of the electronic components, and in which (b) the sandwich arrangement is being sintered, wherein the metal of at least one of the non-pretreated metal contact surfaces of the electronic components is copper, and wherein the sintering step (b) is carried out in an inert but non-reducing atmosphere without application of mechanical pressure at a sintering temperature in the range of 200 to <300° C.

To summarize, the invention comprises the following embodiments 1 to 14:

1. A silver sintering preparation
   either in the form of a silver sintering paste comprising 70 to 95 wt.-% of coated silver particles (A) and 5 to 30 wt.-% of organic solvent (B)
   or in the form of a silver sintering preform comprising 74.5 to 100 wt.-% of coated silver particles (A) and 0 to 0.5 wt.-% of organic solvent (B),
   wherein the coating of the coated silver particles (A) comprises silver acetylacetonate (silver 2,4-pentanedionate) and/or at least one silver salt of the formula $C_nH_{2n+1}COOAg$ with n being an integer in the range of 7 to 10, and
   wherein the at least one silver salt is thermally decomposable at >160° C.

2. The silver sintering preparation in the form of a silver sintering paste of embodiment 1 comprising 75 to 85 wt.-% of the coated silver particles (A) and 8 to 25 wt.-% of organic solvent (B).

3. The sintering preparation in the form of a silver sintering preform of embodiment 1 comprising 96 to 100 wt.-% of the coated silver particles (A) and 0 to 0.5 wt.-% of organic solvent (B).

4. The silver sintering preparation of any one of the preceding embodiments, wherein the alkyl group $C_nH_{2n+1}$ is branched.

5. The silver sintering preparation of embodiment 4, wherein the branching is characterized by the carbon atom in position 2 carrying 2 or 3 alkyl substituents.

6. The silver sintering preparation of any one of the preceding embodiments, wherein the fraction of the silver acetylacetonate and/or the at least one silver salt, relative to the entire coating is at least 60 wt.-%.

7. The silver sintering preparation of any one of the preceding embodiments, wherein the fraction of the silver acetylacetonate and/or the at least one silver salt is ≤20 wt.-%, relative to the weight of the coated silver particles (A).

8. A method for the connection of electronic components, in which (a) a sandwich arrangement is provided, which comprises at least (a1) an electronic component 1, (a2) an electronic component 2, and (a3) a silver sintering preparation of any one of the preceding embodiments being situated between metal contact surfaces of the electronic components, and in which (b) the sandwich arrangement is being sintered.

9. The method of embodiment 8, wherein each of the electronic components 1 and 2 has a metal contact surface.
10. The method of embodiment 9, wherein the metal contact surfaces are made of (i) non-precious metal selected from the group consisting of copper, nickel and aluminum or of (ii) a precious metal or (iii) one of the metal contact surfaces is made of non-precious metal selected from the group consisting of copper, nickel and aluminum and the other is made of precious metal.
11. The method of embodiment 10, wherein there is no pretreatment of a non-precious metal contact surface prior to carrying out the sintering step (b).
12. The method of embodiment 10, wherein the sintering proceeds at a temperature in the range of 200 to <300° C. with or without applying mechanical pressure and/or with or without pretreatment of the precious metal or non-precious metal contact surfaces.
13. The method of embodiment 11, wherein the metal of at least one of the non-pretreated metal contact surfaces of the electronic components is a non-precious metal, and wherein the sintering step (b) is carried out in an inert atmosphere without application of mechanical pressure at a sintering temperature in the range of 200 to <300° C.
14. The method of embodiment 13, wherein the non-precious metal is copper, and wherein the inert atmosphere is a non-reducing atmosphere.

EXAMPLES

1. Production of Silver Sintering Pastes:

Silver sintering pastes 1 to 4 (according to the invention) and a reference paste were produced by mixing the individual ingredients according to Table 1 at comparable rheological behavior. All amounts given are in units of wt.-%.

TABLE 1

|  | Ref. | Ex. 1 | Ex. 2 | Ex. 3 | Ex. 4 |
|---|---|---|---|---|---|
| Silver particles[1]) coated with 1 wt.-% stearic acid | 82 | | | | |
| Silver particles[1]) coated with 1 wt.-% Ag caprylate | | 82 | | | |
| Silver particles[1]) coated with 5 wt.-% Ag neodecanoate | | | 82 | | |
| Silver particles[1]) coated with 10 wt.-% Ag neodecanoate | | | | 82 | |
| Silver particles[1]) coated with 5 wt.-% Ag 2,4-pentanedionate | | | | | 82 |
| Isostearic acid | 2.7 | 2.7 | 2.7 | 2.7 | 2.7 |
| Tripropylene glycol monobutyl ether | 7.2 | 7.2 | 7.2 | 7.2 | 7.2 |
| Butyl polyglycol | 7.7 | 7.7 | 7.7 | 7.7 | 7.7 |
| Ethylcellulose | 0.4 | 0.4 | 0.4 | 0.4 | 0.4 |
| Total | 100 | 100 | 100 | 100 | 100 |

[1])Silver particles having a mean particle size (d50) of 0.5 μm

2. Application and Pressure-Free Sintering of Sintering Compositions:

The respective composition was applied by means of dispensing onto the copper surface of a lead frame made of a copper-rich copper/iron alloy (96 wt.-% copper, 4 wt.-% Fe) to produce a 50 μm thick wet layer. Then, the applied composition was contacted without previous drying to a silicon chip via its 2 mm×2 mm silver metal contact surface. The subsequent pressure-free sintering took place according to the following heating profile in a nitrogen atmosphere comprising max. 50 ppm of oxygen: The contact site was heated steadily to 250° C. over the course of 60 minutes and then maintained at 250° C. for 60 minutes. Then, the so formed arrangement was cooled steadily to 30° C. over the course of 60 minutes.

After the sintering, the bonding strength was determined by shear testing. In this context, the electronic components were sheared off with a shearing chisel at a rate of 0.3 mm/s at room temperature. The force was measured by means of a load cell (DAGE 4000 plus device made by DAGE, Germany). Table 2 shows the results obtained with compositions 1 to 5.

TABLE 2

| | Composition | | | | |
|---|---|---|---|---|---|
| | reference | Example 1 | Example 2 | Example 3 | Example 4 |
| Shear strength at room temperature (N/mm$^2$) | 1.0 | 7.6 | 33.1 | 24.3 | 11.3 |

What is claimed is:

1. A silver sintering preparation, the preparation in the form of
   a silver sintering paste comprising 70 to 95 wt.-% of coated silver particles (A) and 5 to 30 wt.-% of organic solvent (B), or
   a silver sintering preform comprising 74.5 to 100 wt.-% of coated silver particles (A) and 0 to 0.5 wt.-% of organic solvent (B),
   wherein the coating of the coated silver particles (A) comprises silver acetylacetonate (silver 2,4-pentanedionate) and,
   wherein the coated silver particles (A) have a mean particle diameter ($d_{50}$) ranging from 0.2 to 20 μm.

2. The silver sintering preparation of claim 1, wherein the silver sintering preparation is a silver sintering paste comprising 75 to 85 wt.-% of the coated silver particles (A) and 8 to 25 wt.-% of organic solvent (B).

3. The sintering preparation of claim 1, wherein the silver sintering preparation is a silver sintering preform comprising 96 to 100 wt.-% of the coated silver particles (A) and 0 to 0.5 wt.-% of organic solvent (B).

4. The silver sintering preparation of claim 1, wherein the fraction of the silver acetylacetonate silver 2,4-pentanedionate), relative to the entire coating, is at least 60 wt.-%.

5. The silver sintering preparation of claim 1, wherein the fraction of the silver acetylacetonate (silver 2,4-pentanedionate) is ≤20 wt.-%, relative to the weight of the coated silver particles (A).

6. The silver sintering preparation of claim 1, wherein the coated silver particles (A) have a mean particle diameter ($d_{50}$) ranging from 0.5 to 20 μm.

7. The silver sintering preparation of claim 1, wherein the coated silver particles (A) have a mean particle diameter ($d_{50}$) ranging from 0.2 to 10 μm.

8. The silver sintering preparation of claim 1, wherein the silver sintering preparation further comprises up to 2.5 wt.-% of at least one cellulose derivative and/or up to 5 wt.-% of at least one fatty compound, wherein the at least one cellulose derivative is selected from the group consisting of methylcellulose, ethylcellulose, ethylmethylcellulose, carboxycellulose, hydroxypropylcellulose, hydroxyethylcellulose, hydroxymethylcellulose and combinations thereof, the at least one fatty compound is selected from the group consisting of fatty acids, fatty acid esters, fatty acid salts, fatty alcohols, fatty amines, fatty amides and combinations thereof, and when the silver sintering preparation comprises at least one cellulose derivative and at least one fatty compound, the combination of the at least one cellulose derivative and the at least one fatty compound is no more than 4 wt.-% of the silver sintering preparation.

9. The silver sintering preparation of claim 1, wherein the silver sintering preparation is free of polymers other than cellulose derivatives, dispersion agents, surfactants defoaming agents, rheological agents and sintering agents.

10. The silver sintering preparation of claim 1, wherein the coating of the coated silver particles (A) further comprises at least one silver salt of the formula $C_nH_{2n+1}COOAg$ with n being an integer in the range of 7 to 10 wherein the at least one silver salt is thermally decomposable at >160° C.

11. The silver sintering preparation of claim 10, wherein n is an integer ranging from 7 to 9.

12. The silver sintering preparation of claim 10, wherein the alkyl group $C_nH_{2n+1}$ of the at least one silver salt of the formula $C_nH_{2n+1}COOAg$ is branched.

13. The silver sintering preparation of claim 12, wherein the branching is characterized by the carbon atom in position 2 carrying 2 or 3 alkyl substituents.

14. A method for the connection of electronic components, the method comprising:

(a) providing a sandwich arrangement comprising at least (a1) an electronic component 1, (a2) an electronic component 2, and (a3) a silver sintering preparation according to claim 1, the silver sintering preparation situated between metal contact surfaces of the electronic components, and (b) sintering the sandwich arrangement.

15. The method of claim 14, wherein the metal contact surfaces are made of (i) a non-precious metal selected from the group consisting of copper, nickel and aluminum or of (ii) a precious metal or one of the metal contact surfaces is made of a non-precious metal selected from the group consisting of copper, nickel and aluminum and another one of the metal contact surfaces is made of a precious metal.

16. The method of claim 15, wherein the metal contact surfaces are non-precious metal contact surfaces and there is no pretreatment of the non-precious metal contact surfaces prior to carrying out step (b).

17. The method of claim 15, wherein the metal contact surfaces are non-precious metal contact surfaces or precious metal contact surfaces and the sintering proceeds at a temperature in a range of 200 to <300° C. with or without applying mechanical pressure and/or with or without pretreatment of the metal contact surfaces.

18. The method of claim 16, wherein at least one of the metal contact surfaces is a non-precious metal contact surface and there is no pretreatment of the at least one non-precious metal contact surface prior to carrying out step (b), and wherein step (b) is carried out in an inert atmosphere without application of mechanical pressure at a sintering temperature in a range of 200 to <300° C.

\* \* \* \* \*